United States Patent
Wieting

(10) Patent No.: US 8,425,739 B1
(45) Date of Patent: Apr. 23, 2013

(54) IN CHAMBER SODIUM DOPING PROCESS AND SYSTEM FOR LARGE SCALE CIGS BASED THIN FILM PHOTOVOLTAIC MATERIALS

(75) Inventor: Robert D. Wieting, San Jose, CA (US)

(73) Assignee: Stion Corporation, San Jose, CA (US)

(*) Notice: Subject to any disclaimer, the term of this patent is extended or adjusted under 35 U.S.C. 154(b) by 524 days.

(21) Appl. No.: 12/565,749

(22) Filed: Sep. 23, 2009

Related U.S. Application Data

(60) Provisional application No. 61/101,638, filed on Sep. 30, 2008.

(51) Int. Cl.
C23C 14/32 (2006.01)
C23C 14/00 (2006.01)

(52) U.S. Cl.
USPC .................................. 204/192.26; 438/95

(58) Field of Classification Search ............... 204/192.1, 204/192.26; 438/95
See application file for complete search history.

(56) References Cited

U.S. PATENT DOCUMENTS

| | | |
|---|---|---|
| 3,520,732 A | 7/1970 | Nakayama et al. |
| 3,828,722 A | 8/1974 | Reuter et al. |
| 3,975,211 A | 8/1976 | Shirland |
| 4,062,038 A | 12/1977 | Cuomo et al. |
| 4,332,974 A | 6/1982 | Fraas |
| 4,335,266 A | 6/1982 | Mickelsen et al. |
| 4,441,113 A | 4/1984 | Madan |
| 4,442,310 A | 4/1984 | Carlson et al. |
| 4,461,922 A | 7/1984 | Gay et al. |
| 4,465,575 A | 8/1984 | Love et al. |
| 4,471,155 A | 9/1984 | Mohr et al. |

(Continued)

FOREIGN PATENT DOCUMENTS

| | | |
|---|---|---|
| AU | 1998/78651 B2 | 2/1999 |
| AU | 2001/40599 A1 | 8/2001 |

(Continued)

OTHER PUBLICATIONS

Ellmer et al., Copper Indium Disulfide Solar Cell Absorbers Prepared in a One-Step Process by Reactive Magnetron Sputtering from Copper and Indium Targets; Elsevier Science B.V; Thin Solid Films 413 (2002) pp. 92-97.

(Continued)

Primary Examiner — Keith Hendricks
Assistant Examiner — Ibrahime A Abraham
(74) Attorney, Agent, or Firm — Kilpatrick Townsend & Stockton LLP

(57) ABSTRACT

A method of processing a photovoltaic materials using a sputtering process including providing at least one transparent substrate having an overlying first electrode layer. The method further including forming an overlying copper and gallium layer using a first sputtering process within a first chamber from a first target including a copper species and a gallium species. Additionally, the method includes forming an indium layer overlying the copper and the gallium layer using a second sputtering process within the first chamber from a second target including an indium species. The method further includes forming a sodium bearing layer overlying the indium layer using a third sputtering process within the first chamber, thereby forming a composite film including the copper and gallium layer, the indium layer, and the sodium bearing layer. Furthermore, the method includes subjecting the composite film to at least a thermal treatment process to form a chalcopyrite absorber layer comprising copper, indium, gallium, and sodium therein.

28 Claims, 4 Drawing Sheets

U.S. PATENT DOCUMENTS

| | | |
|---|---|---|
| 4,499,658 A | 2/1985 | Lewis |
| 4,507,181 A | 3/1985 | Nath et al. |
| 4,517,403 A | 5/1985 | Morel et al. |
| 4,518,855 A | 5/1985 | Malak |
| 4,532,372 A | 7/1985 | Nath et al. |
| 4,542,255 A | 9/1985 | Tanner et al. |
| 4,581,108 A | 4/1986 | Kapur et al. |
| 4,589,194 A | 5/1986 | Roy |
| 4,598,306 A | 7/1986 | Nath et al. |
| 4,599,154 A | 7/1986 | Bender et al. |
| 4,611,091 A | 9/1986 | Choudary et al. |
| 4,623,601 A | 11/1986 | Lewis et al. |
| 4,625,070 A | 11/1986 | Berman et al. |
| 4,638,111 A | 1/1987 | Gay |
| 4,661,370 A | 4/1987 | Tarrant |
| 4,663,495 A | 5/1987 | Berman et al. |
| 4,705,912 A | 11/1987 | Nakashima et al. |
| 4,724,011 A | 2/1988 | Turner et al. |
| 4,727,047 A | 2/1988 | Bozler et al. |
| 4,751,149 A | 6/1988 | Vijayakumar et al. |
| 4,775,425 A | 10/1988 | Guha et al. |
| 4,793,283 A | 12/1988 | Sarkozy |
| 4,798,660 A | 1/1989 | Ermer et al. |
| 4,816,082 A | 3/1989 | Guha et al. |
| 4,816,420 A | 3/1989 | Bozler et al. |
| 4,837,182 A | 6/1989 | Bozler et al. |
| 4,865,999 A | 9/1989 | Xi et al. |
| 4,873,118 A | 10/1989 | Elias et al. |
| 4,915,745 A | 4/1990 | Pollock et al. |
| 4,950,615 A | 8/1990 | Basol et al. |
| 4,968,354 A | 11/1990 | Nishiura et al. |
| 4,996,108 A | 2/1991 | Divigalpitiya et al. |
| 5,008,062 A | 4/1991 | Anderson et al. |
| 5,011,565 A | 4/1991 | Dube et al. |
| 5,028,274 A | 7/1991 | Basol et al. |
| 5,039,353 A | 8/1991 | Schmitt |
| 5,045,409 A | 9/1991 | Eberspacher et al. |
| 5,069,727 A | 12/1991 | Kouzuma et al. |
| 5,078,803 A | 1/1992 | Pier et al. |
| 5,125,984 A | 6/1992 | Kruehler et al. |
| 5,133,809 A | 7/1992 | Sichanugrist et al. |
| 5,137,835 A | 8/1992 | Karg |
| 5,154,777 A | 10/1992 | Blackmon et al. |
| 5,180,686 A | 1/1993 | Banerjee et al. |
| 5,211,824 A | 5/1993 | Knapp |
| 5,217,564 A | 6/1993 | Bozler et al. |
| 5,231,047 A | 7/1993 | Ovshinsky et al. |
| 5,248,345 A | 9/1993 | Sichanugrist et al. |
| 5,259,883 A | 11/1993 | Yamabe et al. |
| 5,261,968 A | 11/1993 | Jordan |
| 5,298,086 A | 3/1994 | Guha et al. |
| 5,336,381 A | 8/1994 | Dalzell, Jr. et al. |
| 5,336,623 A | 8/1994 | Sichanugrist et al. |
| 5,346,853 A | 9/1994 | Guha et al. |
| 5,397,401 A | 3/1995 | Toma et al. |
| 5,399,504 A * | 3/1995 | Ohsawa .................. 438/16 |
| 5,436,204 A | 7/1995 | Albin et al. |
| 5,445,847 A | 8/1995 | Wada |
| 5,474,939 A | 12/1995 | Pollock et al. |
| 5,501,744 A | 3/1996 | Albright et al. |
| 5,512,107 A | 4/1996 | Van den Berg |
| 5,528,397 A | 6/1996 | Zavracy et al. |
| 5,536,333 A | 7/1996 | Foote et al. |
| 5,578,103 A | 11/1996 | Araujo et al. |
| 5,578,503 A | 11/1996 | Karg et al. |
| 5,622,634 A | 4/1997 | Noma et al. |
| 5,626,688 A | 5/1997 | Probst et al. |
| 5,665,175 A | 9/1997 | Safir |
| 5,676,766 A | 10/1997 | Probst et al. |
| 5,698,496 A | 12/1997 | Fastnacht et al. |
| 5,726,065 A | 3/1998 | Szlufcik et al. |
| 5,738,731 A | 4/1998 | Shindo et al. |
| 5,868,869 A | 2/1999 | Albright et al. |
| 5,925,228 A | 7/1999 | Panitz et al. |
| 5,977,476 A | 11/1999 | Guha et al. |
| 5,981,868 A | 11/1999 | Kushiya et al. |
| 5,985,691 A | 11/1999 | Basol et al. |
| 6,040,521 A | 3/2000 | Kushiya et al. |
| 6,048,442 A | 4/2000 | Kushiya et al. |
| 6,092,669 A | 7/2000 | Kushiya et al. |
| 6,107,562 A | 8/2000 | Hashimoto et al. |
| 6,127,202 A | 10/2000 | Kapur et al. |
| 6,160,215 A | 12/2000 | Curtin |
| 6,166,319 A | 12/2000 | Matsuyama |
| 6,172,297 B1 | 1/2001 | Hezel et al. |
| 6,258,620 B1 | 7/2001 | Morel et al. |
| 6,294,274 B1 | 9/2001 | Kawazoe et al. |
| 6,307,148 B1 | 10/2001 | Takeuchi et al. |
| 6,323,417 B1 * | 11/2001 | Gillespie et al. .............. 136/262 |
| 6,328,871 B1 | 12/2001 | Ding et al. |
| RE37,512 E | 1/2002 | Szlufcik et al. |
| 6,361,718 B1 | 3/2002 | Shinmo et al. |
| 6,372,538 B1 | 4/2002 | Wendt et al. |
| 6,423,565 B1 | 7/2002 | Barth et al. |
| 6,632,113 B1 | 10/2003 | Noma et al. |
| 6,635,307 B2 | 10/2003 | Huang et al. |
| 6,653,701 B1 | 11/2003 | Yamazaki et al. |
| 6,667,492 B1 | 12/2003 | Kendall |
| 6,690,041 B2 | 2/2004 | Armstrong et al. |
| 6,692,820 B2 | 2/2004 | Forrest et al. |
| 6,784,492 B1 | 8/2004 | Morishita |
| 6,852,920 B2 | 2/2005 | Sager et al. |
| 6,878,871 B2 | 4/2005 | Scher et al. |
| 6,974,976 B2 | 12/2005 | Hollars |
| 7,122,398 B1 | 10/2006 | Pichler |
| 7,179,677 B2 | 2/2007 | Ramanathan et al. |
| 7,194,197 B1 | 3/2007 | Wendt et al. |
| 7,220,321 B2 | 5/2007 | Barth et al. |
| 7,235,736 B1 | 6/2007 | Buller et al. |
| 7,252,923 B2 | 8/2007 | Kobayashi |
| 7,265,037 B2 | 9/2007 | Yang et al. |
| 7,319,190 B2 | 1/2008 | Tuttle |
| 7,364,808 B2 | 4/2008 | Sato et al. |
| 7,442,413 B2 | 10/2008 | Zwaap et al. |
| 7,544,884 B2 | 6/2009 | Hollars |
| 7,736,755 B2 | 6/2010 | Igarashi et al. |
| 7,741,560 B2 | 6/2010 | Yonezawa |
| 7,855,089 B2 | 12/2010 | Farris, III et al. |
| 7,863,074 B2 | 1/2011 | Wieting |
| 7,910,399 B1 | 3/2011 | Wieting |
| 7,955,891 B2 | 6/2011 | Wieting |
| 7,960,204 B2 | 6/2011 | Lee |
| 7,993,954 B2 | 8/2011 | Wieting |
| 7,993,955 B2 | 8/2011 | Wieting |
| 7,998,762 B1 | 8/2011 | Lee et al. |
| 8,003,430 B1 | 8/2011 | Lee |
| 8,008,110 B1 | 8/2011 | Lee |
| 8,008,111 B1 | 8/2011 | Lee |
| 8,008,112 B1 | 8/2011 | Lee |
| 8,017,860 B2 | 9/2011 | Lee |
| 8,142,521 B2 | 3/2012 | Wieting |
| 8,168,463 B2 | 5/2012 | Wieting |
| 8,178,370 B2 | 5/2012 | Lee et al. |
| 8,183,066 B2 | 5/2012 | Lee et al. |
| 8,217,261 B2 | 7/2012 | Wieting |
| 8,263,494 B2 | 9/2012 | Patterson |
| 8,287,942 B1 | 10/2012 | Huang et al. |
| 2002/0002992 A1 | 1/2002 | Kariya et al. |
| 2002/0004302 A1 | 1/2002 | Fukumoto et al. |
| 2002/0061361 A1 | 5/2002 | Nakahara et al. |
| 2002/0063065 A1 | 5/2002 | Sonoda et al. |
| 2003/0075717 A1 | 4/2003 | Kondo et al. |
| 2003/0089899 A1 | 5/2003 | Lieber et al. |
| 2003/0188777 A1 | 10/2003 | Gaudiana et al. |
| 2003/0230338 A1 | 12/2003 | Menezes |
| 2004/0063320 A1 | 4/2004 | Hollars |
| 2004/0084080 A1 | 5/2004 | Sager et al. |
| 2004/0095658 A1 | 5/2004 | Buretea et al. |
| 2004/0110393 A1 | 6/2004 | Munzer et al. |
| 2004/0161539 A1 | 8/2004 | Miyakawa |
| 2004/0187917 A1 | 9/2004 | Pichler |
| 2004/0245912 A1 | 12/2004 | Thurk et al. |
| 2004/0252488 A1 | 12/2004 | Thurk |
| 2004/0256001 A1 | 12/2004 | Mitra et al. |
| 2005/0074915 A1 | 4/2005 | Tuttle et al. |
| 2005/0098205 A1 | 5/2005 | Roscheisen et al. |
| 2005/0109392 A1 | 5/2005 | Hollars |

| | | |
|---|---|---|
| 2005/0164432 A1 | 7/2005 | Lieber et al. |
| 2005/0194036 A1 | 9/2005 | Basol |
| 2005/0287717 A1 | 12/2005 | Heald et al. |
| 2006/0034065 A1 | 2/2006 | Thurk |
| 2006/0040103 A1 | 2/2006 | Whiteford et al. |
| 2006/0051505 A1 | 3/2006 | Kortshagen et al. |
| 2006/0096536 A1 | 5/2006 | Tuttle |
| 2006/0096537 A1 | 5/2006 | Tuttle |
| 2006/0096635 A1 | 5/2006 | Tuttle |
| 2006/0102230 A1 | 5/2006 | Tuttle |
| 2006/0112983 A1 | 6/2006 | Parce et al. |
| 2006/0130890 A1 | 6/2006 | Hantschel et al. |
| 2006/0160261 A1 | 7/2006 | Sheats et al. |
| 2006/0173113 A1 | 8/2006 | Yabuta et al. |
| 2006/0174932 A1 | 8/2006 | Usui et al. |
| 2006/0219288 A1 | 10/2006 | Tuttle |
| 2006/0219547 A1 | 10/2006 | Tuttle |
| 2006/0220059 A1 | 10/2006 | Satoh et al. |
| 2006/0249202 A1 | 11/2006 | Yoo et al. |
| 2006/0267054 A1 | 11/2006 | Martin et al. |
| 2007/0006914 A1 | 1/2007 | Lee |
| 2007/0089782 A1 | 4/2007 | Scheuten et al. |
| 2007/0116892 A1 | 5/2007 | Zwaap |
| 2007/0116893 A1 | 5/2007 | Zwaap |
| 2007/0151596 A1 | 7/2007 | Nasuno et al. |
| 2007/0163643 A1 | 7/2007 | Van Duren et al. |
| 2007/0169810 A1 | 7/2007 | Van Duren et al. |
| 2007/0193623 A1 | 8/2007 | Krasnov |
| 2007/0209700 A1 | 9/2007 | Yonezawa et al. |
| 2007/0264488 A1 | 11/2007 | Lee |
| 2007/0283998 A1 | 12/2007 | Kuriyagawa et al. |
| 2007/0289624 A1 | 12/2007 | Kuriyagawa et al. |
| 2008/0029154 A1 | 2/2008 | Milshtein et al. |
| 2008/0032044 A1 | 2/2008 | Kuriyagawa et al. |
| 2008/0041446 A1 | 2/2008 | Wu et al. |
| 2008/0057616 A1 | 3/2008 | Robinson et al. |
| 2008/0092945 A1 | 4/2008 | Munteanu et al. |
| 2008/0092953 A1 | 4/2008 | Lee |
| 2008/0092954 A1 | 4/2008 | Choi |
| 2008/0105294 A1 | 5/2008 | Kushiya et al. |
| 2008/0110491 A1 | 5/2008 | Buller et al. |
| 2008/0110495 A1 | 5/2008 | Onodera et al. |
| 2008/0121264 A1 | 5/2008 | Chen et al. |
| 2008/0121277 A1 | 5/2008 | Robinson et al. |
| 2008/0204696 A1 | 8/2008 | Kamijima |
| 2008/0210303 A1 | 9/2008 | Lu et al. |
| 2008/0280030 A1 | 11/2008 | Van Duren et al. |
| 2008/0283389 A1* | 11/2008 | Aoki .................. 204/192.15 |
| 2009/0021157 A1 | 1/2009 | Kim et al. |
| 2009/0058295 A1 | 3/2009 | Auday et al. |
| 2009/0084438 A1 | 4/2009 | den Boer et al. |
| 2009/0087940 A1 | 4/2009 | Kushiya |
| 2009/0087942 A1 | 4/2009 | Meyers |
| 2009/0145746 A1 | 6/2009 | Hollars |
| 2009/0217969 A1 | 9/2009 | Matsushima et al. |
| 2009/0234987 A1 | 9/2009 | Lee et al. |
| 2009/0235983 A1 | 9/2009 | Girt et al. |
| 2009/0235987 A1 | 9/2009 | Akhtar et al. |
| 2009/0293945 A1 | 12/2009 | Peter |
| 2010/0081230 A1 | 4/2010 | Lee |
| 2010/0087016 A1 | 4/2010 | Britt et al. |
| 2010/0087026 A1 | 4/2010 | Winkeler et al. |
| 2010/0096007 A1 | 4/2010 | Mattmann et al. |
| 2010/0101648 A1 | 4/2010 | Morooka et al. |
| 2010/0101649 A1 | 4/2010 | Huignard et al. |
| 2010/0122726 A1 | 5/2010 | Lee |
| 2010/0197051 A1 | 8/2010 | Schlezinger et al. |
| 2010/0210064 A1 | 8/2010 | Hakuma et al. |
| 2010/0233386 A1 | 9/2010 | Krause et al. |
| 2010/0258179 A1 | 10/2010 | Wieting |
| 2010/0267189 A1 | 10/2010 | Yu et al. |
| 2010/0267190 A1 | 10/2010 | Hakuma et al. |
| 2011/0018103 A1 | 1/2011 | Wieting |
| 2011/0020980 A1 | 1/2011 | Wieting |
| 2011/0070682 A1 | 3/2011 | Wieting |
| 2011/0070683 A1 | 3/2011 | Wieting |
| 2011/0070684 A1 | 3/2011 | Wieting |
| 2011/0070685 A1 | 3/2011 | Wieting |
| 2011/0070686 A1 | 3/2011 | Wieting |
| 2011/0070687 A1 | 3/2011 | Wieting |
| 2011/0070688 A1 | 3/2011 | Wieting |
| 2011/0070689 A1 | 3/2011 | Wieting |
| 2011/0070690 A1 | 3/2011 | Wieting |
| 2011/0071659 A1 | 3/2011 | Farris, III et al. |
| 2011/0073181 A1 | 3/2011 | Wieting |
| 2011/0203634 A1 | 8/2011 | Wieting |
| 2011/0212565 A1 | 9/2011 | Wieting |
| 2011/0259395 A1 | 10/2011 | Wieting et al. |
| 2011/0259413 A1 | 10/2011 | Wieting et al. |
| 2011/0269260 A1 | 11/2011 | Buquing |
| 2011/0277836 A1 | 11/2011 | Lee |
| 2012/0003789 A1 | 1/2012 | Doering et al. |
| 2012/0021552 A1 | 1/2012 | Alexander et al. |
| 2012/0094432 A1 | 4/2012 | Wieting |
| 2012/0122304 A1 | 5/2012 | Wieting |
| 2012/0186975 A1 | 7/2012 | Lee et al. |
| 2012/0240989 A1 | 9/2012 | Ramanathan et al. |
| 2012/0270341 A1 | 10/2012 | Lee et al. |

FOREIGN PATENT DOCUMENTS

| | | |
|---|---|---|
| DE | 3314197 A1 | 11/1983 |
| DE | 10104726 A1 | 8/2002 |
| DE | 102005062977 B3 | 9/2007 |
| FR | 2646560 | 11/1990 |
| GB | 2124826 A | 2/1984 |
| JP | 2000/173969 | 6/2000 |
| JP | 2000/219512 | 8/2000 |
| JP | 2002/167695 | 6/2002 |
| JP | 2002/270871 | 9/2002 |
| JP | 2002/299670 | 10/2002 |
| JP | 2004/332043 | 11/2004 |
| JP | 2005/311292 | 11/2005 |
| WO | 01/57932 A1 | 8/2001 |
| WO | 2005/011002 | 2/2005 |
| WO | WO 2005109525 A1 * | 11/2005 |
| WO | 2006/126598 A1 | 11/2006 |
| WO | 2007/022221 A2 | 2/2007 |
| WO | 2007/077171 A2 | 7/2007 |
| WO | 2008/025326 A2 | 3/2008 |

OTHER PUBLICATIONS

International Search Report & Written Opinion of PCT Application No. PCT/US 09/46161, date of mailing Jul. 27, 2009, 14 pages total.

International Search Report & Written Opinion of PCT Application No. PCT/US 09/46802, mailed on Jul. 31, 2009, 11 pages total.

Onuma et al., Preparation and Characterization of CuInS Thin Films Solar Cells with Large Grain, Elsevier Science B.V; Solar Energy Materials & Solar Cells 69 (2001) pp. 261-269.

Baumann, A., et al., Photovoltaic Technology Review, presentation Dec. 6, 2004, 18 pages.

Chopra et al., "Thin-Film Solar Cells: An Overview", 2004, Progress in Photovoltaics: Research and Applications, 2004, vol. 12, pp. 69-92.

Guillen C., "CuInS2 Thin Films Grown Sequentially from Binary Sulfides as Compared to Layers Evaporated Directly from the Elements", Semiconductor Science and Technology, vol. 21, No. 5, May 2006, pp. 709-712.

Huang et al., Photoluminescence and Electroluminescence of ZnS:Cu Nanocrystals in Polymeric Networks, Applied Physics, Lett. 70 (18), May 5, 1997, pp. 2335-2337.

Huang et al., Preparation of $ZnxCd1_xS$ Nanocomposites in Polymer Matrices and their Photophysical Properties, Langmuir 1998, 14, pp. 4342-4344.

International Solar Electric Technology, Inc. (ISET) "Thin Film CIGS", Retrieved from http://www.isetinc.com/cigs.html on Oct. 1, 2008, 4 pages.

Kapur et al., "Fabrication of CIGS Solar Cells via Printing of nanoparticle Precursor Inks", DOE Solar Program Review Meeting 2004, DOE/GO-102005-2067, p. 135-136.

Kapur et al., "Non-Vacuum Printing Process for CIGS Solar Cells on Rigid and Flexible Substrates", 29th IEEE Photovoltaic Specialists Conf., New Orleans, LA, IEEE, 2002, pp. 688-691.

Kapur et al., "Non-Vacuum Processing of CIGS Solar Cells on Flexible Polymer Substrates", Proceedings of the Third World Conference on Photovoltaic Energy Conversion, Osaka, Japan, 2P-D3-43, 2003.

Kapur et al., "Non-Vacuum Processing of CuIn$_{1-x}$Ga$_x$Se$_2$ Solar Cells on Rigid and Flexible Substrates using Nanoparticle Precursor Inks", Thin Solid Films, 2003, vol. 431-432, pp. 53-57.

Kapur et al., "Fabrication of Light Weight Flexible CIGS Solar Cells for Space Power Applications", Materials Research Society, Proceedings vol. 668, (2001) pp. H3.5.1-H3.5.6.

Kapur et al., "Nanoparticle Oxides Precursor Inks for Thin Film Copper Indium Gallium Selenide (CIGS) Solar Cells", Materials Research Society Proceedings, vol. 668, (2001) pp. H2.6.1-H2.6.7.

Mehta et al., "A graded diameter and oriented nanorod-thin film structure for solar cell application: a device proposal", Solar Energy Materials & Solar Cells, 2005, vol. 85, pp. 107-113.

Salvador, "Hole diffusion length in n-TiO2 single crystals and sintered electrodes: photoelectrochemical determination and comparative analysis," Journa; of Applied Physics, vol. 55, No. 8, pp. 2977-2985, Apr. 15, 1984.

Srikant V., et al., "On the Optical Band Gap of Zinc Oxide", Journal of Applied Physics, vol. 83, No. 10, May 15, 1998, pp. 5447-5451.

Yang et al., "Preparation, Characterization and Electroluminescence of ZnS Nanocrystals in a Polymer Matrix", Journal Material Chem., 1997, vol. 7, No. 1, pp. 131-133.

Yang et al., "Electroluminescence from ZnS/CdS Nanocrystals/Polymer Composite", Synthetic Metals 1997, vol. 91, pp. 347-349.

Yang et al., "Fabrication and Characteristics of ZnS Nanocrystals/ Polymer Composite Doped with Tetraphenylbenzidine Single Layer Structure Light-emitting Diode", Applied Physics Letters, vol. 69, No. 3, Jul. 15, 1996, pp. 377-379.

\* cited by examiner

US 8,425,739 B1

IN CHAMBER SODIUM DOPING PROCESS AND SYSTEM FOR LARGE SCALE CIGS BASED THIN FILM PHOTOVOLTAIC MATERIALS

CROSS-REFERENCES TO RELATED APPLICATIONS

This application claims priority to U.S. Provisional Patent Application No. 61/101,638, filed Sep. 30, 2008, entitled "IN CHAMBER SODIUM DOPING PROCESS AND SYSTEM FOR LARGE SCALE CIGS BASED THIN FILM PHOTOVOLTAIC MATERIALS" by inventor Robert D. Wieting, commonly assigned and incorporated by reference herein for all purposes.

STATEMENT AS TO RIGHTS TO INVENTIONS MADE UNDER FEDERALLY SPONSORED RESEARCH AND DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention relates generally to photovoltaic materials and manufacturing method. More particularly, the present invention provides a method and structure for fabricating a thin film solar cells. Merely by way of example, the present method includes in-chamber sodium doping for manufacture of chalcopyrite structured thin film photovoltaic cells base on a large scale batch system, but it would be recognized that the invention may have other configurations.

From the beginning of time, mankind has been challenged to find way of harnessing energy. Energy comes in the forms such as petrochemical, hydroelectric, nuclear, wind, biomass, solar, and more primitive forms such as wood and coal. Over the past century, modern civilization has relied upon petrochemical energy as an important energy source. Petrochemical energy includes gas and oil. Gas includes lighter forms such as butane and propane, commonly used to heat homes and serve as fuel for cooking Gas also includes gasoline, diesel, and jet fuel, commonly used for transportation purposes. Heavier forms of petrochemicals can also be used to heat homes in some places. Unfortunately, the supply of petrochemical fuel is limited and essentially fixed based upon the amount available on the planet Earth. Additionally, as more people use petroleum products in growing amounts, it is rapidly becoming a scarce resource, which will eventually become depleted over time.

More recently, environmentally clean and renewable sources of energy have been desired. An example of a clean source of energy is hydroelectric power. Hydroelectric power is derived from electric generators driven by the flow of water produced by dams such as the Hoover Dam in Nevada. The electric power generated is used to power a large portion of the city of Los Angeles in California. Clean and renewable sources of energy also include wind, waves, biomass, and the like. That is, windmills convert wind energy into more useful forms of energy such as electricity. Still other types of clean energy include solar energy. Specific details of solar energy can be found throughout the present background and more particularly below.

Solar energy technology generally converts electromagnetic radiation from the sun to other useful forms of energy. These other forms of energy include thermal energy and electrical power. For electrical power applications, solar cells are often used. Although solar energy is environmentally clean and has been successful to a point, many limitations remain to be resolved before it becomes widely used throughout the world. As an example, one type of solar cell uses crystalline materials, which are derived from semiconductor material ingots. These crystalline materials can be used to fabricate optoelectronic devices that include photovoltaic and photodiode devices that convert electromagnetic radiation into electrical power. However, crystalline materials are often costly and difficult to make on a large scale. Additionally, devices made from such crystalline materials often have low energy conversion efficiencies. Other types of solar cells use "thin film" technology to form a thin film of photosensitive material to be used to convert electromagnetic radiation into electrical power. Similar limitations exist with the use of thin film technology in making solar cells. That is, efficiencies are often poor. Additionally, film reliability is often poor and cannot be used for extensive periods of time in conventional environmental applications. Often, thin films are difficult to mechanically integrate with each other. Furthermore, integration of electrode layers and overlying absorber layers formed on sodium containing substrate is also problematic, especially for large scale manufacture. These and other limitations of these conventional technologies can be found throughout the present specification and more particularly below.

BRIEF SUMMARY OF THE INVENTION

The present invention relates generally to photovoltaic materials and manufacturing method. More particularly, the present invention provides a method and structure for fabricating a thin film solar cells. Merely by way of example, the present method includes in-chamber sodium doping for manufacture of chalcopyrite structured thin film photovoltaic cells base on a large scale batch system, but it would be recognized that the invention may have other configurations.

In a specific embodiment, the present invention provides a method of processing a photovoltaic materials using a sputtering process. The method includes providing at least one transparent substrate having an overlying first electrode layer. Additionally, the method includes forming, using a first sputtering process within a first chamber, an overlying copper and gallium layer from a first target including a copper species and a gallium species. The method further includes forming, using a second sputtering process within the first chamber, an indium layer overlying the copper and the gallium layer from a second target including an indium species.

Furthermore, the method includes forming, using a third sputtering process within the first chamber, a sodium bearing layer overlying the indium layer. Thereby, a composite film including the copper and gallium layer, the indium layer, and the sodium bearing layer is formed. Moreover, the method includes subjecting the composite film to at least a thermal treatment process to form a chalcopyrite absorber layer comprising copper, indium, gallium, and sodium therein.

In another specific embodiment, the present invention provides a method of processing a photovoltaic materials using a sputtering process. The method includes providing at least one transparent substrate having an overlying first electrode layer. The method includes forming an overlying copper and gallium layer from a first target including a copper species and a gallium species using a first sputtering process within a first chamber. Additionally, the method includes forming an indium layer overlying the copper and the gallium layer from a second target including an indium species using a second sputtering process within the first chamber. The method further includes transferring the transparent substrate including the indium layer overlying the copper layer to a second chamber without breaking vacuum between the first chamber and the second chamber to maintain the copper gallium layer and indium layer substantially free from moisture. Furthermore, the method includes forming a sodium bearing layer overlying the indium layer using a third sputtering process within the second chamber. In the end, a composite film including the copper and gallium layer, the indium layer, and the sodium bearing layer is formed. Moreover, the method includes subjecting the composite film to at least a thermal treatment process to form a chalcopyrite absorber layer comprising copper, indium, gallium, and sodium therein and maintaining the transparent substrate including the composite film to an environment substantially free from moisture.

In yet another alternative embodiment, the present invention provides a method of processing a photovoltaic absorber material. The method includes providing a substrate having an overlying a molybdenum layer. Additionally, the method includes forming a sodium bearing layer overlying the molybdenum layer. Furthermore, the method includes forming a precursor layer comprising copper, gallium, and indium overlying the sodium bearing layer. Moreover, the method includes subjecting the precursor layer to a thermal treatment process to form a photovoltaic absorber layer comprising a chalcopyrite structure bearing with copper, indium, gallium, and sodium therein. In a specific embodiment, the forming the sodium bearing layer is performed by sputtering on a target bearing $Na_2SeO_3$ with total 8 at % of sodium mixed with copper and gallium. In another specific embodiment, the thermal treatment of the precursor layer is performed within a gaseous environment containing selenium.

Many benefits can be achieved by applying the embodiments of the present invention. Particularly, a sodium doping process serves an important step for forming copper based chalcopyrite structured high efficiency photovoltaic absorber layer. The present invention provides a efficient way using an in-chamber sputtering process to perform the sodium doping to achieve a well controlled sodium concentration in the formed absorber precursor layer. The method simplifies the doping process with optional interchangeable order to perform one or more sputtering processes that leads to the formation of a copper, gallium, and indium based composite film. The in-chamber sodium doping can be performed in a same sputtering chamber (may in different compartments) for the composite film or in different chambers which all can be configured to be parts of a large scale batch system. Of course, there can be other variations, modifications, and alternatives.

These and other benefits may be described throughout the present specification and more particularly below.

DETAILED DESCRIPTION OF THE INVENTION

The present invention relates generally to photovoltaic materials and manufacturing method. More particularly, the present invention provides a method and structure for fabricating a thin film solar cells. Merely by way of example, the present method includes in-chamber sodium doping for manufacture of chalcopyrite structured thin film photovoltaic cells base on a large scale batch system, but it would be recognized that the invention may have other configurations.

Figure 1:
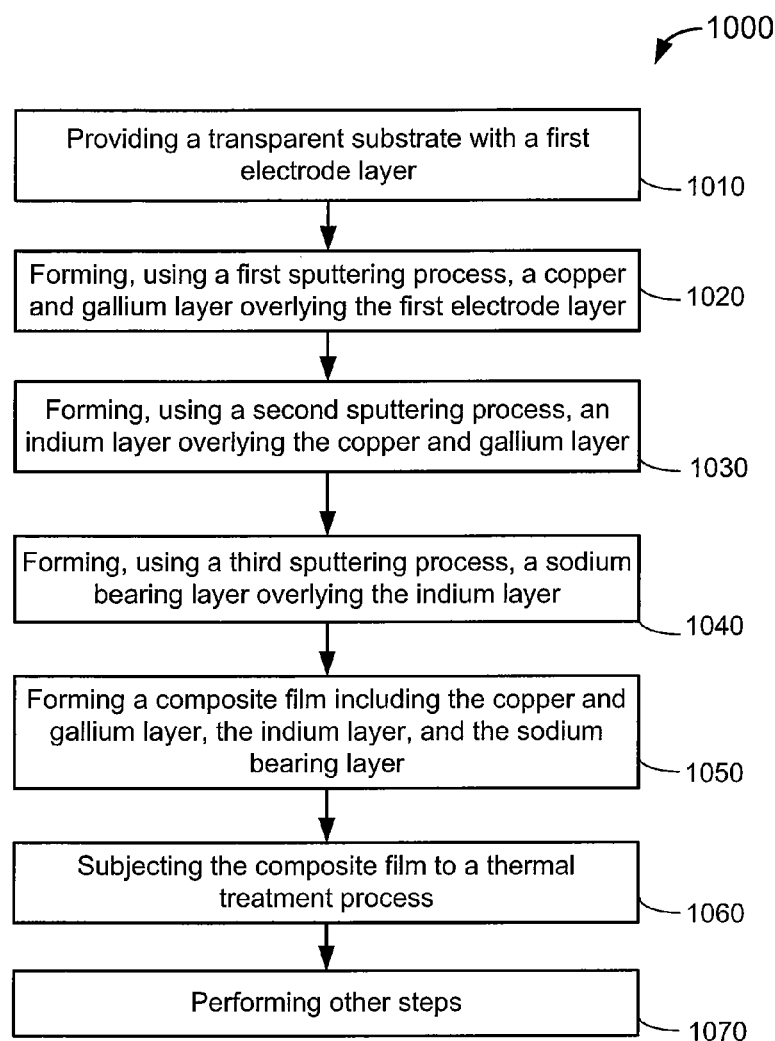
FIG. 1 is a simplified flowchart illustrating a method of fabricating a thin film photovoltaic cell according to an embodiment of the present invention.

FIG. 1 is a simplified flowchart illustrating a method of fabricating a thin film photovoltaic cell according to an embodiment of the present invention. This diagram is merely an example, which should not unduly limit the scope of the claims herein. The method 1000 includes the following processes:

1. Process 1010 for providing a transparent substrate overlaid with a first electrode layer;
2. Process 1020 for forming, using a first sputtering process within a first chamber, a copper and gallium layer overlying the first electrode layer;
3. Process 1030 for forming, using a second sputtering process within the first chamber, an indium layer overlying the copper and gallium layer;
4. Process 1040 for forming, using a third sputtering process within the first chamber, a sodium bearing layer overlying the indium layer; thereby (1050) forming a composite film including the copper and gallium layer, the indium layer, and the sodium bearing layer;
5. Process 1060 for subjecting the composite film to at least a thermal treatment process to form a chalcopyrite absorber layer;
6. Process 1070 for performing other steps.

The above sequence of processes provides a method of forming a chalcopyrite absorber layer for fabricating thin film photovoltaic cells according to an embodiment of the present invention. In a specific embodiment, the method includes an in chamber sodium doping process of forming a sodium bearing layer over an indium layer before performing a thermal treatment process. In another specific embodiment, the method also includes performing one or more sputtering processes in a same chamber with different compartment for forming one or more layers comprising copper, gallium, indium, and sodium. Other alternatives can also be provided where processes are added, one or more processes are removed, or one or more processes are provided in a different sequence without departing from the scope of the claims herein. For example, the sodium bearing layer can be performed using a salt spray process. In another example, a salt dip process can be used for forming the sodium bearing layer overlying an indium layer. Some processes mentioned above can be performed in a different order while other processes may be inserted in between. For example, the sodium bearing layer is deposited overlying the first electrode layer followed by the deposition of copper, gallium species and then indium species. Further details of the method can be found throughout the present specification and more particularly below.

Figure 2:
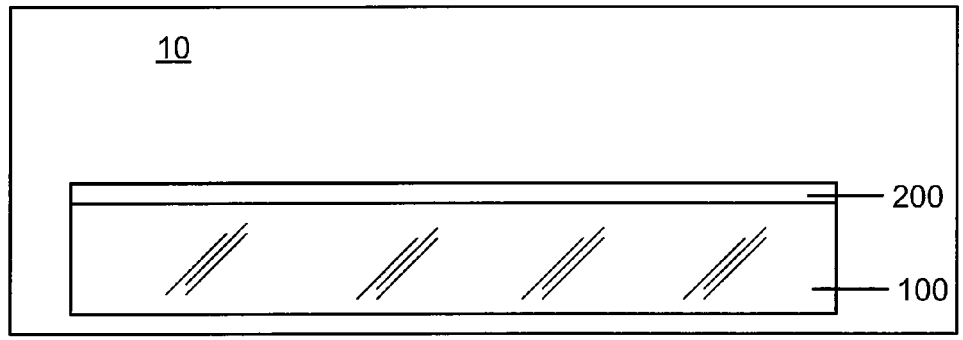
FIGS. 2-6 are schematic diagrams illustrating a method comprising a series of processes and structures for fabricating a thin film photovoltaic cell according to certain embodiments of the present invention.

At Process 1010, a soda lime glass substrate is provided. This process can be visually illustrated by FIG. 2. FIG. 2 is a simplified diagram illustrating a transparent substrate provided for fabricating a thin film photovoltaic cell according to an embodiment of the present invention. This diagram is merely an example, which should not unduly limit the scope of the claims herein. One of ordinary skill in the art would recognize many variations, alternatives, and modifications. As shown, the transparent substrate 100 including an overlying first electrode layer 200 is provided in a chamber 10. In an embodiment, the first electrode layer 200 can include a barrier layer formed between a conductor layer (e.g., molybdenum layer) and the substrate 100. In one example, the transparent substrate 100 uses a soda lime glass which has been widely used as window glass as well as the substrate for forming thin film photovoltaic cells due to an obvious economical reason. The soda lime glass naturally contains alkaline ions (e.g., $Na^+$) which provide a positive influence on the grain growth of thin film photovoltaic materials thereon. For example, polycrystalline semiconductor films of $CuIn(Ga)Se_2$ or $CuInSe_2$ materials can be formed on soda lime glass substrates with coarse grain sizes of a few microns or larger. The sodium ion also acts as a dopant in the absorber for the photovoltaic cell. Therefore, these photovoltaic films made on the soda lime glass according to the present invention can have high cell current with light-conversion efficiencies of 17% or above.

In an implementation of the present invention, the first electrode layer comprises a layer of molybdenum material. The layer of molybdenum layer also can be pre-coated on the commercially available soda lime glass when it is provided as the transparent substrate. Alternatively in a specific implementation, the first electrode layer is formed on an uncoated and pre-washed soda lime glass substrate using one or more deposition processes. The chamber 10 can be a vacuum chamber configured to load a soda lime glass substrate 100 to perform the one or more deposition processes including sputtering formation of the first electrode layer 200. In a specific embodiment, the chamber 10 can be one of a plurality of chambers or subsystems within a large scale batch system for manufacturing thin film solar cells.

The first electrode layer 200 mentioned above functionally serves a lower or back electrode for a thin film photovoltaic cell formed thereafter on the substrate 100. In an example, the first electrode layer 200 includes a bi-layer structured molybdenum material. Particularly, a first molybdenum layer is formed overlying the soda lime glass substrate using a sputtering process at relative lower pressure of about 2 millitorr. The first molybdenum layer is substantially under a tensile stress. Subsequently, a second molybdenum layer is formed overlying the first molybdenum layer using a sputtering process at relative higher pressure of about 20 millitorr. The second molybdenum layer is substantially under a compressive stress and has a thickness of about 2000 Angstroms or about ten times thicker than the first molybdenum layer. Such bi-layer molybdenum structure with a desired strain field provides benefit of using a laser patterning process to form certain patterns substantially free of film cracking. In one embodiment, the laser patterning process can be one of a plurality of processes performed within the same batch system. As a result, the first electrode layer with a plurality of patterns suitable for corresponding interconnect structures can be prepared before subsequent processes of manufacturing thin film photovoltaic cells using large scale batch system.

Figure 3:
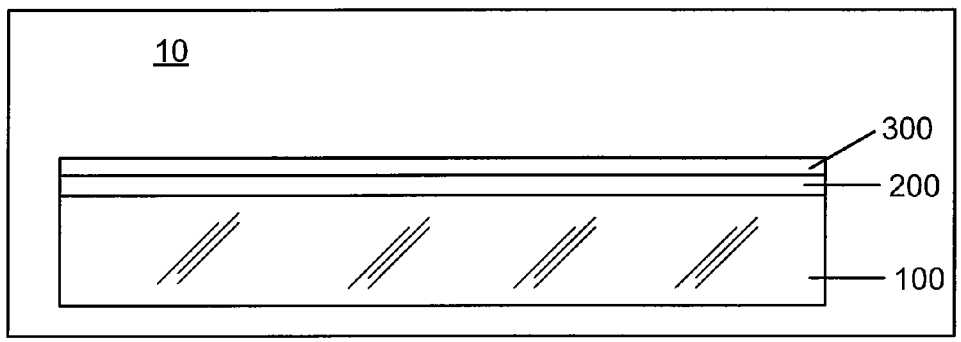

Referring to FIG. 1, the method 1000 further includes a first sputtering process (Process 1020) of forming a copper and gallium layer overlying the first electrode layer. This process can be visually illustrated by FIG. 3. FIG. 3 is a simplified diagram illustrating a first sputtering process for forming a composite film of photovoltaic material according to an embodiment of the present invention. This diagram is merely an example, which should not unduly limit the scope of the claims herein. One of ordinary skill in the art would recognize many variations, alternatives, and modifications. As shown, a copper and gallium layer 300 is formed overlying the first electrode layer 200 on the transparent substrate 100. In an example, the copper and gallium layer 300 is formed using a first sputtering process. In an implementation, the first sputtering process can be carried out in the chamber 10 where a copper sputtering target and a gallium target are respectively disposed for depositing copper and gallium respectively in different compartment of the same chamber 10. In another implementation, an Cu—Ga alloy target with desirable Cu:Ga composition is used and a single sputtering process is performed in the chamber 10. The first sputtering process and the first electrode layer deposition can also be performed in different compartments of the same chamber 10.

In a specific embodiment, a DC magnetron sputtering process can be used to deposit a copper layer onto the first electrode layer under a following condition. The deposition pressure (using Ar gas) in the chamber 10 is controlled to be about 6.2 mTorr. The gas flow rate is set to about 32 sccm. The deposition temperature can be just at room temperature without need of intentionally heating the substrate. The deposition can also be performed over a preheated substrate. Of course, minor substrate heating may be resulted due to the plasma generated during the deposition. Additionally, the DC power supply of about 115 W may be required. According to certain embodiments, DC power in a range from 100 W to 150 W is suitable depending specific cases with different materials. The full deposition time for a copper-gallium layer of about 170 nm or thicker is about 6 minutes or more.

In an alternative embodiment, the thin layer of gallium-bearing material can be formed by sputtering a gallium-bearing target within an environment provided with argon gas. The sputtering process may use a power of about 120 Watts DC for about ten seconds and less according to a specific embodiment. The argon gas is provided at about a suitable flow rate. In a preferred embodiment, the deposition process is maintained in a vacuum environment, which is about 5 mTorr and less or about 1 mTorr to about 42 mTorr. In a specific embodiment, the gallium-bearing target material (e.g., Cu—Ga, or Ga—S target) is characterized by at least 10 to 25 atomic % and preferably about 15 atomic % of gallium concentration. Additionally, the deposition process can be performed under suitable temperatures such as about 50 Degrees Celsius to about 110 Degrees Celsius according to a specific embodiment. The copper-gallium target used for this sputtering process can be pre-selected to have a copper content richer than gallium content. For example, the copper content can be in a range from a determined amount of balance the gallium species or combination of other species. Details about techniques of forming an alternative copper-gallium based high efficiency photovoltaic thin film using a large scale batch system processing can be found in U.S. Patent Application No. 61/059,253 and U.S. Patent Application No. 60/988,089, commonly assigned to Stion Corporation of San Jose, Calif., and hereby incorporated by reference for all purposes. The process 1020 is just a process that leads to a formation of a composite film as a precursor for forming a photovoltaic absorber layer with a chalcopyrite structure. Further description about this composite film can be found in more detail below.

Figure 4:
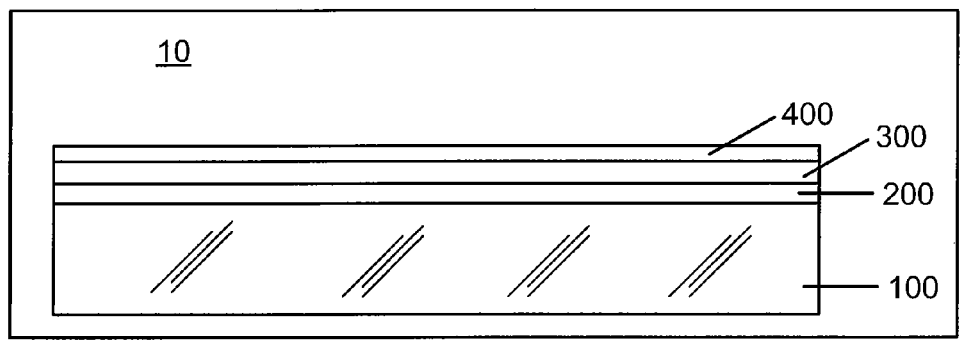

In a next process (1030), the method 1000 includes a second sputtering process for forming an indium layer overlying the copper and gallium layer. This process can be visually illustrated by FIG. 4. FIG. 4 is a simplified diagram illustrating a second sputtering process for forming a composite film of photovoltaic material according to an embodiment of the present invention. This diagram is merely an example, which should not unduly limit the scope of the claims herein. One of ordinary skill in the art would recognize many variations, alternatives, and modifications. As shown, an indium layer 400 is formed overlying the copper and gallium layer 300 formed earlier. In an example, the indium layer 400 can be formed using a sputtering process that is carried out in a same chamber 10 for performing the first sputtering process (i.e., the process 1020). In order to avoid or at least reduce mutual contamination and provide options for modify local sputtering environment, the second sputtering process can be performed within a different compartment where the transparent substrate 100 is transferred from a previous compartment for performing the first sputtering process. In another example, the indium layer 400 is deposited over the copper and gallium layer 300 using a DC magnetron sputtering process under a similar condition for depositing the copper layer. The deposition time for the indium layer may be shorter than that for copper (and gallium) layer. For example, 2 minutes and 45 seconds may be enough for depositing an indium layer of about 300 nm in thickness (or thicker indium layer for thicker absorber structure). The process 1030 of forming the indium layer 300 is just another part of a process of forming the composite film, in particular aiming to have a desired copper: indium ratio in final composition of a photovoltaic absorber layer thereafter.

Figure 5:
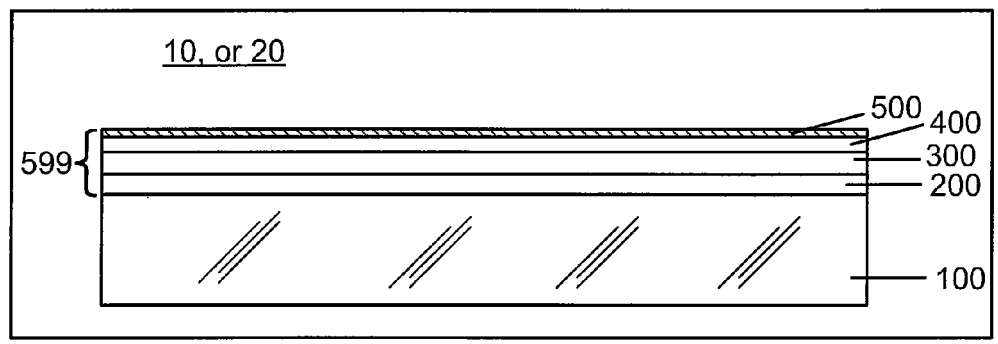

Referring again to FIG. 1, the method 1000 includes a third sputtering process (Process 1040) for forming a sodium bearing layer overlying the indium layer. This process can be visually illustrated by FIG. 5. FIG. 5 is a simplified diagram illustrating a third sputtering process for forming a composite film of photovoltaic material according to an embodiment of the present invention. This diagram is merely an example, which should not unduly limit the scope of the claims herein. One of ordinary skill in the art would recognize many variations, alternatives, and modifications. As shown, a sodium bearing layer 500 is formed overlying the indium layer 400 formed earlier in Process 1030. In a specific embodiment, the third sputtering process is carried out in a same chamber 10 for previous first and second sputtering processes but can be performed in a different compartment. In an alternative specific embodiment, the substrate 100 with overlying electrode layer 200, copper and gallium layer 300, and indium layer 400 can be transferred from the first chamber 10 to a second chamber 20 without breaking vacuum between them to maintain the copper gallium layer 300 and indium layer 400 substantially free from moisture. In particular, the chamber 20 can be held in a high vacuum condition with a pressure set to be smaller than $10^{-6}$ microbar for performing the third sputtering process. The chamber 20 can be further supported by a cryogenic pump for attracting water vapor. In anther specific embodiment, the third sputtering process uses a sodium bearing target with a uniform composition of the sodium species distributed within a host material. Of course, depending on applications, there can be certain variations, modifications, and alternatives.

In an example, the sodium bearing layer 500 is formed on top of the indium layer 400. In another example, the second sputtering process is performed before the first sputtering process. In other words, the indium layer 400 can be deposited first. Then, a sodium bearing layer 500 is added, using the third sputtering process, overlying the indium layer 400. Afterwards, a copper layer or a copper and gallium layer can be deposited, using the first sputtering process, overlying the sodium bearing layer 500. In general, a thin film structure including sodium bearing species over the indium layer can help to prevent or at least substantially reduce the chance for sodium species to access the first electrode layer formed therebelow.

Figure 1A:
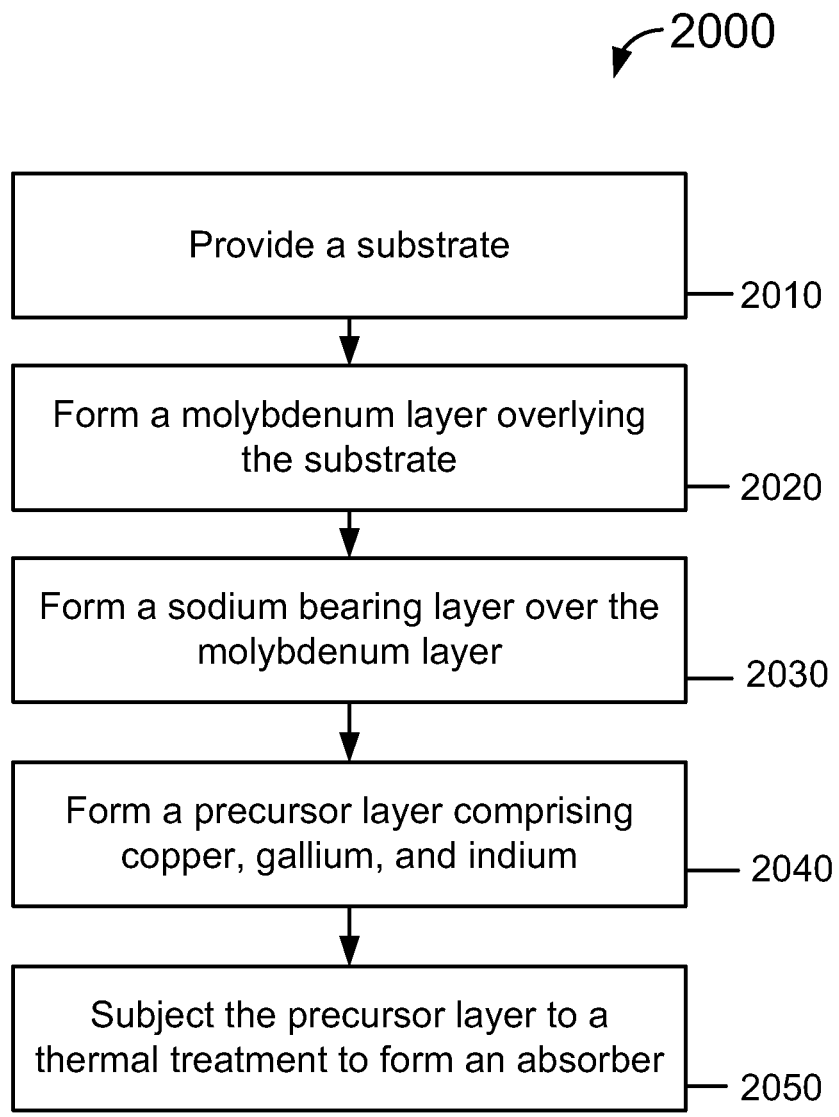

In an alternative embodiment as shown in FIG. 1A, the sodium bearing species is deposited by the first sputtering process (2020) using a target containing a compound $Na_2SeO_3$ mixed with copper and gallium species. The Na content in the target is only 8% or less. Otherwise, the sodium atoms (ions) in the sodium bearing species would cause some reactive damage to the interface between the first electrode layer, e.g., a molybdenum layer, or even delamination of the molybdenum layer from the overlying absorber layer. Following that, the second sputtering process (2030) using a copper+gallium target and the third sputtering process (2040) on an indium target are performed to form a composite film as a precursor layer for forming a photovoltaic absorber in a subsequent thermal treatment process. The thermal treatment process includes ramping up process temperature to 500 Degrees Celsius within a gaseous environment containing selenium. Of course, other steps can be performed in between or after the above steps.

In another alternative embodiment, the sodium bearing layer 500 formed by the third sputtering process becomes a part of a composite film 599 that includes the copper and gallium layer 300 formed in the first sputtering process and the indium layer 400 formed in the second sputtering process. On the other hand, the third sputtering process provides an in-chamber sodium doping with a desired stoichiometry required for transforming the composite film 599 into a photovoltaic absorber layer. Furthermore, the process for transforming the composite film into a photovoltaic absorber layer can be found in the description below.

Figure 6:
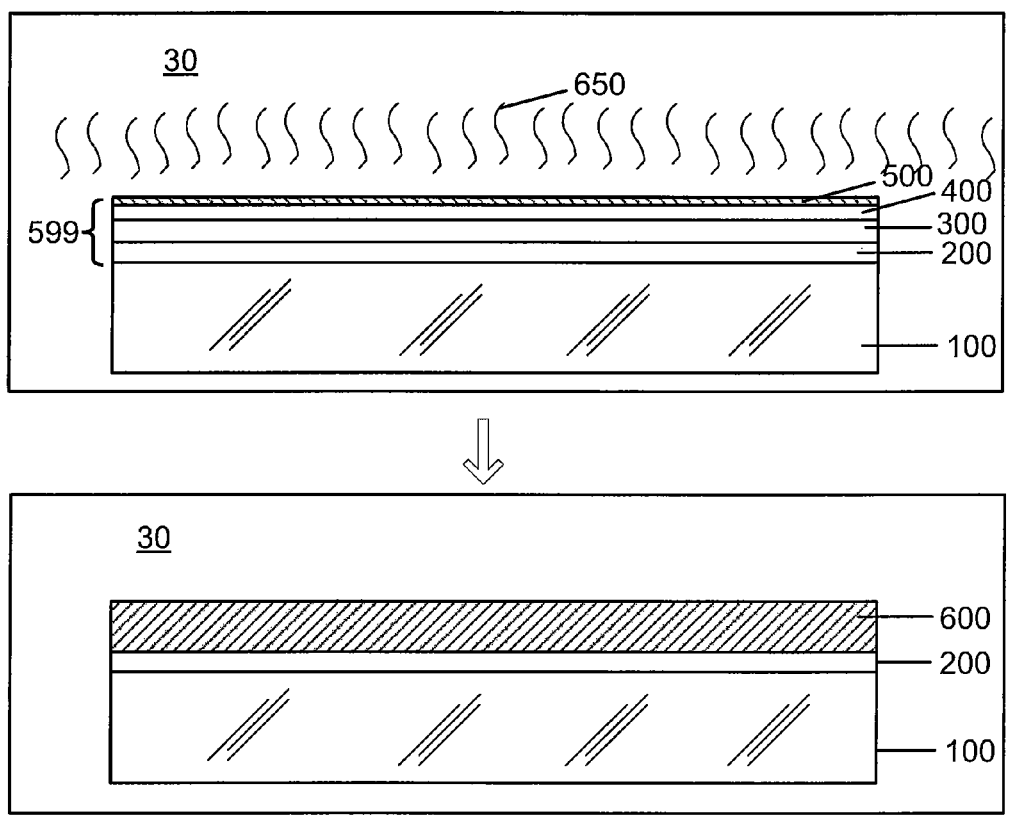

In the end of the process 1040, and with options for interchanging an order of performing the first sputtering process, the second sputtering process, and the third sputtering process, a composite film 599 comprising copper, gallium, indium, and sodium species is formed at process 1050. Subsequently, the method 1000 includes a process (Process 1060) of subjecting the composite film 599 to a thermal treatment process to form a photovoltaic absorber layer with chalcopyrite structure. This process can be visually illustrated by FIG. 6. FIG. 6 is a simplified diagram illustrating a thermal treatment process for transforming the composite film 599 to a photovoltaic absorber layer according to an embodiment of the present invention. This diagram is merely an example, which should not unduly limit the scope of the claims herein. One of ordinary skill in the art would recognize many variations, alternatives, and modifications. After the formation of the composite film 599 including the copper and gallium layer 300, the indium layer 400, and sodium bearing layer 500 respectively in several sputter deposition processes, the transparent substrate 100 can be transferred via a transfer tool from the first chamber 10 or second chamber 20 into a diffusion furnace 30 (not shown in detail). Again, the transferring tool (not shown) should be at least designed to ensure that the composite film 599 overlying the substrate is not exposed to moisture with humidity higher than 10% RH. The first chamber 10, the second chamber 20, and the furnace 30, including some transferring tools, can all be configured to be parts of a same large scale batch system. In an implementation, the first chamber 10 and the second chamber 20 are the same. As shown in FIG. 6, the transparent substrate 100 covered with the composite film 599 is subjected to a thermal treatment process 650 within the diffusion furnace 30. In fact, multiple prepared substrates (up to 40 or more) can be loaded (usually hanging vertically to prevent it from sagging, etc.) into the diffusion furnace 30 of the large scale batch system for the process at the same time.

In a specific embodiment, the thermal treatment process 650 is carried at a variable temperature environment capable ramping up from room temperature to about 500 degree Celsius or even greater. The diffusion furnace 30 can be configured to ramp up the temperature with a desired rate and control the temperature to a suitable range with an accuracy of about ±a few degrees. In one example, the diffusion furnace 30 is a custom designed rapid thermal processor. In another specific embodiment, the thermal treatment process 650 is carried out in an environment comprising a fluidic selenide-bearing material. The thermal treatment process 650 is also a selenization process. In one example, the fluidic selenide bearing material is a gas phase elemental selenium (or selenium vapor). In another example, hydrogen selenide $H_2Se$ gas is used. The thermal treatment is substantially a reactive annealing and diffusion process. Sometime, nitrogen gas can be added for enhancing thermal uniformity within the diffusion furnace. In one implementation for large batch system, suitable temperature profile needs to be obtained. The thermal treatment process usually begins at room temperature with a certain composition of hydrogen selenide gas mixed with nitrogen gas provided into the diffusion furnace 30. The temperature is ramped up to about 420±20 Degrees Celsius at the same composition of gas mix, then is held there for a period of time of about ½ hour to one hour. Then the working gas is pumped out to remove selenide species to stop the reactive process. Then the $H_2S$ gas is flowed in before the temperature is further ramped up to about 500 degree Celsius or even higher. Optionally, nitrogen gas also is added for keeping glass substrates at a substantially uniform temperature. Adding $H_2S$ gas can help to change band and optical profile of the photovoltaic absorber layer to create higher open circuit voltage by passivating interfaces and creating back surface fields. As the result of the specific thermal treatment process, a film 600 of copper indium gallium diselenide compound $CuIn(Ga)Se_2$ (CIGS) or $CuInSe_2$ (CIS) in chalcopyrite structure can be formed.

According to an embodiment of the present invention, the formation of CIGS chalcopyrite absorber layer is carried out after performing the in-chamber sodium doping process (the third sputtering process 1040). The sodium bearing layer 500 added in process 1040 plays an important role in helping the growth of polycrystalline chalcopyrite structured grains in the film 600 during the thermal treatment process. In particular, the sodium atoms under a controlled doping concentration help the chalcopyrite grains to grow in relative large size up to a few microns. Without the assistance of sodium atoms or with un-controlled excessive supply of sodium content, the chalcopyrite grains would become substantially finer, leading to a great reduction in photovoltaic current and degradation of the efficiency of the solar device. According to embodiments of the present invention, the sodium content can be well controlled by the in-chamber sodium doping process, which is simply a sputtering process (e.g., the third sputtering process) using a sodium bearing target with a uniform composition of the sodium species distributed within a host material. In an embodiment, a preferred sodium concentration within the CIGS chalcopyrite photovoltaic absorber layer is about $5 \times 10^{19}$ atom/cm$^3$. In certain other embodiments, sodium doping can also be carried out by a salt spraying process or a salt dipping process. Of course, there are many alternatives, variations, and modifications for performing sodium doping for forming the chalcopyrite photovoltaic absorber layer.

In an alternative embodiment, the thermal treatment process 650 can be also a sulfidation process where the furnace 30 is held in an environment with a fluidic-phase sulfur bearing species. For example, the sulfur bearing species can be provided in a solution, which has dissolved $Na_2S$, $CS_2$, $(NH_4)_2S$, thiosulfate, and others. In another example, the sulfur bearing species can be hydrogen sulfide in gas phase. As the result of these specific thermal treatment processes involving sulfide, a film 600 of copper indium gallium disulfide compound material $CuIn(Ga)S_2$ or $CuInS_2$ also in chalcopyrite structure can be formed. In general, the thermal treatment process would cause reaction between the selenium/sulfur and the deposited composite film including copper, indium, gallium, and sodium. The reaction under a suitable condition at least leads to a formation of the film 600 that contains a plurality of chalcopyrite structured grains.

Although the above has been generally described in terms of a specific structure for CIS and/or CIGS thin film solar cells, other specific CIS and/or CIGS configurations can also be used, such as those noted in U.S. Pat. No. 4,612,411 and U.S. Pat. No. 4,611,091, which are hereby incorporated by reference herein, without departing from the invention described by the claims herein.

In certain other embodiments, the method 1000 can include one or more processes 1070 that are required for fabricating a thin film photovoltaic cells on the transparent substrate. For example, the method 1000 may include a process of forming a cadmium sulfide layer as a window layer overlying the chalcopyrite photovoltaic absorber layer. The cadmium sulfide layer is characterized as a wide bandgap semiconductor for the thin film photovoltaic cells formed thereafter. In one example, the cadmium sulfide layer 505 can be formed using sputtering, vacuum evaporation, or chemical bath deposition (CBD) techniques and doped with $n^+$-type impurities for conductivity. Depending on embodiments, the window layer can be selected from a group materials consisting of a cadmium sulfide (CdS), a zinc sulfide (ZnS), zinc selenium (ZnSe), zinc oxide (ZnO), zinc magnesium oxide (ZnMgO), or others.

Additionally, an upper electrode layer should be added overlying the chalcopyrite absorber layer, or in some embodiments, directly overlying a window layer. The upper electrode layer typically requires to be optically transparent. One widely used material for the upper electrode layer is transparent conductive oxide. For example, a zinc oxide film characterized with a resistivity of about $10^{-3}$ $\Omega$cm and less is used. In a specific embodiment, a first zinc oxide layer will be added overlying the window layer. In another specific embodiment, a second zinc oxide layer is inserted between the window layer and the first zinc oxide layer. In a specific embodiment, the second zinc oxide layer has a higher resistivity than the first zinc oxide layer. Functionally, the second zinc oxide layer plays more a role of barrier/protection layer while the first zinc oxide layer with lower resisitivity plays more a role of conductive electrode layer. In certain embodiment, the zinc oxide layer is formed using a metalorganic chemical vapor deposition (MOCVD) technique within the same large scale batch system.

Furthermore, the method 1000 may include a process of maintaining the transparent substrate including the composite film to an environment substantially free from moisture. This process may be performed after the in-chamber sodium doping process and before the thermal treatment process. In an implementation, this process is performed after forming a copper and gallium layer and an indium layer in a first chamber but before transferring into a second chamber for performing sodium doping process. In another implementation, this process also is performed after the formation of copper based chalcopyrite photovoltaic absorber layer but before transferring into diffusion furnace. Due to the specific film composition including copper, gallium, indium, sodium species, exposing the film to humidity of water vapor may cause serious damage to the grain structure of the film and eventually cause degradation of its photovoltaic efficiency. In one example, a work piece, e.g., the soda lime glass substrate with the overlying composition film or the just formed photovoltaic absorber layer or the absorber layer plus window layer, can be stored in a desicator with a humidity less than 10% RH. In another example, the work piece can be stored inside an aqueous solution.

Although the above has been illustrated according to specific embodiments, there can be other modifications, alternatives, and variations. It is understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of processing a photovoltaic materials using a sputtering process, the method comprising:
    providing at least one transparent substrate having an overlying first electrode layer;
    forming, using a first sputtering process within a first chamber, an overlying copper and gallium layer from a first target including a copper species and a gallium species;
    forming, using a second sputtering process within the first chamber, an indium layer overlying the copper and the gallium layer from a second target including an indium species;
    forming, using a third sputtering process within the first chamber, a sodium bearing layer overlying the indium layer, thereby forming a composite film including the copper and gallium layer, the indium layer, and the sodium bearing layer, wherein forming the sodium bearing layer is performed by sputtering on a target bearing Na2SeO3 with total 8 at % of sodium mixed with copper and gallium; and
    subjecting the composite film to at least a thermal treatment process to form a chalcopyrite absorber layer comprising copper, indium, gallium, and sodium therein.

2. The method of claim 1 wherein the transparent substrate comprises a soda lime glass substrate.

3. The method of claim 1 wherein the first electrode layer comprises a bi-layer molybdenum material.

4. The method of claim 1 wherein the chalcopyrite absorber layer comprises a compound semiconductor of CuInSe$_2$ (CIS) or CuIn(Ga)Se$_2$ (CIGS) or CuIn(Ga)S$_2$ with sodium doping.

5. The method of claim 1 wherein the chalcopyrite absorber layer comprises sodium with an average atomic density of about $5 \times 10^{19}$ atoms/cm$^3$ throughout the absorber layer after thermal treatment process.

6. The method of claim 1 wherein the third sputtering process uses a sodium bearing target with a uniform composition of the sodium species distributed within a host material.

7. The method of claim 1 wherein the first sputtering process, the second sputtering process, and the third sputtering process are carried out in a same chamber but different compartment.

8. The method of claim 1 wherein the thermal treatment process is performed at a temperature ramping up from room temperature to above about 500 degree Celsius or greater.

9. The method of claim 1 wherein the thermal treatment process is performed in a fluidic selenide or fluidic sulfide environment.

10. A method of processing a photovoltaic material using a sputtering process, the method comprising:
    providing at least one transparent substrate having an overlying first electrode layer;
    forming, using a first sputtering process within a first chamber, an overlying copper and gallium layer from a first target including a copper species and a gallium species;
    forming, using a second sputtering process within the first chamber, an indium layer overlying the copper and the gallium layer from a second target including an indium species;
    transferring the transparent substrate including the indium layer overlying the copper layer to a second chamber without breaking vacuum between the first chamber and the second chamber to maintain the copper gallium layer and indium layer substantially free from moisture;
    forming, using a third sputtering process within the second chamber, a sodium bearing layer overlying the indium layer, thereby forming a composite film including the copper and gallium layer, the indium layer, and the sodium bearing layer, wherein forming the sodium bearing layer is performed by sputtering on a target bearing Na2SeO3 with total 8 at % of sodium mixed with copper and gallium;
    subjecting the composite film to at least a thermal treatment process to form a chalcopyrite absorber layer comprising copper, indium, gallium, and sodium therein; and
    maintaining the transparent substrate including the composite film to an environment substantially free from moisture.

11. The method of claim 10 wherein the environment comprises dry air.

12. The method of claim 10 wherein the environment comprises dry nitrogen.

13. The method of claim 10 wherein the transparent substrate comprises a soda lime glass substrate.

14. The method of claim 10 wherein the first electrode layer comprises molybdenum material.

15. The method of claim 10 wherein the chalcopyrite absorber layer comprises a compound semiconductor of CuInSe$_2$ (CIS) or CuIn(Ga)Se$_2$ (CIGS) or CuIn(Ga)S$_2$.

16. The method of claim 10 wherein the chalcopyrite absorber layer comprises sodium concentration of about $5 \times 10^{19}$ atoms/cm$^3$ after thermal treatment process.

17. The method of claim 10 wherein the third sputtering process uses a sodium bearing target with a uniform composition of the sodium species distributed within a host material.

18. The method of claim 10 wherein the first sputtering process, the second sputtering process, and the third sputtering process are carried out in a same chamber but different compartment.

19. The method of claim 10 wherein the thermal treatment process is performed in a fluidic selenide or fluidic sulfide environment within a diffusion furnace.

20. The method of claim 19 wherein the fluidic selenide environment comprises a hydrogen selenide gas and the fluidic sulfide environment comprises a hydrogen sulfide gas.

21. The method of claim 19 wherein the thermal treatment process is performed with nitrogen gas added to enhance temperature uniformity in the diffusion furnace.

22. A method of processing a photovoltaic material, the method comprising:
    providing a substrate having an overlying a molybdenum layer;
    forming a sodium bearing layer overlying the molybdenum layer, wherein forming the sodium bearing performed by sputtering on a target bearing $Na_2SeO_3$ with total 8 at % of sodium mixed with copper and gallium;

forming a precursor layer comprising copper, gallium, and indium overlying the sodium bearing layer; and subjecting the precursor layer to a thermal treatment process to form a photovoltaic absorber layer comprising a chalcopyrite structure bearing with copper, indium, gallium, and sodium therein.

23. The method of claim 22 wherein the substrate is a smooth plate.

24. The method of claim 22 wherein subjecting the precursor layer to a thermal treatment comprises ramping up process temperature to 500 Degrees Celsius within a gaseous environment containing selenium.

25. A method of processing a photovoltaic materials using a sputtering process, the method comprising:

providing at least one transparent substrate having an overlying first electrode layer;

performing a first sputtering process within a first chamber utilizing a first target to deposit a first layer;

performing a second sputtering process within the first chamber utilizing a second target to deposit a second layer;

performing a third sputtering process within the first chamber utilizing a third target bearing Na2SeO3 with total 8 at % of sodium mixed with copper and gallium to deposit a third layer; and subjecting the composite film to at least a thermal treatment process to form a chalcopyrite absorber layer comprising copper, indium, gallium, and sodium therein.

26. The method of claim 25 wherein the first sputtering process deposits a copper and gallium layer overlying the electrode from the first target including a copper species and a gallium species, wherein the second sputtering process deposits an indium layer overlying the copper and gallium layer from the second target including an indium species, and wherein the third sputtering process deposits a sodium bearing layer overlying the indium layer from the third target including a sodium species.

27. The method of claim 25 wherein the first sputtering process deposits an indium layer overlying the electrode from the first target including an indium species, wherein the second sputtering process deposits a copper and gallium layer overlying the indium layer from the second target including a copper species and a gallium species, and wherein the third sputtering process deposits a sodium bearing layer overlying the copper and gallium layer from the third target including a sodium species.

28. The method of claim 25 wherein the first sputtering process deposits an indium layer overlying the electrode from the first target including an indium species, wherein the second sputtering process deposits a sodium bearing layer overlying the indium layer from the second target including a sodium species, and wherein the third sputtering process deposits a copper and gallium layer overlying the sodium layer from the third target including a copper species and a gallium species.

* * * * *